(12) United States Patent
Kawashima (10) Patent No.: US 10,658,261 B2
(45) Date of Patent: May 19, 2020

(54) SEMICONDUCTOR DEVICE (71) Applicant: Denso Corporation, Kariya, Aichi-pref (JP)

(72) Inventor: Takanori Kawashima, Anjo (JP)

(73) Assignee: Denso Corporation, Kariya, Aichi-pref (JP)

( * ) Notice: Subject to any disclaimer, the term of this patent is extended or adjusted under 35 U.S.C. 154(b) by 0 days.

(21) Appl. No.: 16/260,579

(22) Filed: Jan. 29, 2019

(65) Prior Publication Data
US 2019/0237381 A1  Aug. 1, 2019

(30) Foreign Application Priority Data
Jan. 30, 2018 (JP) .................. 2018-013706

(51) Int. Cl.
| | |
|---|---|
| H01L 23/36 | (2006.01) |
| H01L 23/58 | (2006.01) |
| H01L 23/433 | (2006.01) |
| H01L 23/367 | (2006.01) |
| H01L 23/373 | (2006.01) |
| H01L 23/31 | (2006.01) |
| H01L 23/051 | (2006.01) |

(52) U.S. Cl.
CPC .......... *H01L 23/36* (2013.01); *H01L 23/3677* (2013.01); *H01L 23/3735* (2013.01); *H01L 23/4334* (2013.01); *H01L 23/585* (2013.01); *H01L 23/051* (2013.01); *H01L 23/3107* (2013.01)

(58) Field of Classification Search
CPC ................................. H01L 2924/351
See application file for complete search history.

(56) References Cited

U.S. PATENT DOCUMENTS

| | | | | |
|---|---|---|---|---|
| 4,926,242 | A * | 5/1990 | Itoh ................. | C22C 1/0416 165/905 |
| 5,325,265 | A * | 6/1994 | Turlik ............... | H01L 23/3736 257/714 |
| 2005/0110128 | A1* | 5/2005 | Ahn ................. | H01L 23/49575 257/686 |
| 2006/0018100 | A1* | 1/2006 | Guo .................. | H01L 24/49 361/719 |

(Continued)

FOREIGN PATENT DOCUMENTS

| | | |
|---|---|---|
| JP | 2007-042827 A | 2/2007 |
| JP | 2008-041752 A | 2/2008 |

*Primary Examiner* — Thao P Le
(74) *Attorney, Agent, or Firm* — Dinsmore & Shohl LLP (57) ABSTRACT

A semiconductor device includes a first semiconductor element having an upper electrode and a lower electrode, a first upper heat sink connected to the upper electrode, and a first lower heat sink connected to the lower electrode. The first lower heat sink is opposed to the first upper heat sink such that the first semiconductor element is sandwiched between the upper and lower heat sinks. One of the first upper heat sink and the first lower heat sink is a laminated substrate having an insulator substrate (such as a ceramic substrate) and conductor layers disposed on opposite surfaces of the insulator substrate, and the other of the first upper heat sink and the first lower heat sink is a conductor plate that is a conductor having higher thermal conductivity than the insulator substrate.

11 Claims, 5 Drawing Sheets (56) References Cited

U.S. PATENT DOCUMENTS

2007/0111397 A1* 5/2007 Kim .................... H01L 23/3128
                                                    438/124
2008/0131655 A1* 6/2008 Wacker .................... B22F 7/04
                                                    428/119

* cited by examiner

SEMICONDUCTOR DEVICE

CROSS-REFERENCE TO RELATED APPLICATIONS

This application claims priority to Japanese Patent Application No. 2018-013706 filed on Jan. 30, 2018, which is incorporated herein by reference in its entirety including the specification, drawings and abstract.

BACKGROUND

1. Technical Field

The technology disclosed in this specification relates to a semiconductor device.

2. Description of Related Art

A semiconductor device disclosed in Japanese Patent Application Publication No. 2008-41752 (JP 2008-41752 A) includes a semiconductor element having an upper electrode and a lower electrode, an upper heat sink connected to the upper electrode, and a lower heat sink connected to the lower electrode. The lower heat sink is opposed to the upper heat sink such that the semiconductor element is sandwiched between the upper heat sink and the lower heat sink. Each of the upper heat sink and the lower heat sink is formed from a laminated substrate having conductor layers disposed on opposite surfaces of a ceramic substrate.

SUMMARY

The laminated substrate having an insulator substrate, such as a ceramic substrate, has a low linear coefficient of expansion; therefore, the laminated substrate can curb thermal deformation of the semiconductor device, and reduce stress generated in the semiconductor element. Thus, in semiconductor devices required to operate with large current, it has been proposed to use laminated substrates for all of the heat sinks, in place of known conductor plates formed of copper or aluminum, as in the semiconductor device as described above. However, materials (e.g., ceramics, such as silicon nitride) that form the insulator substrates have poorer thermal conductivity than conductors (e.g., copper and aluminum) that form the known heat sinks. Thus, if the insulator substrates are used for the heat sinks, stress generated in the semiconductor element is reduced, but heat dissipation of the semiconductor element is also reduced, thus giving rise to a trade-off situation. This specification provides a technology that can solve or lessen the trade-off.

A semiconductor device disclosed in this specification includes a first semiconductor element having an upper electrode and a lower electrode, a first upper heat sink connected to the upper electrode, and a first lower heat sink connected to the lower electrode. The first lower heat sink is opposed to the first upper heat sink such that the first semiconductor element is sandwiched between the first upper heat sink and the first lower heat sink. In the semiconductor device, one of the first upper heat sink and the first lower heat sink is a laminated substrate having an insulator substrate (e.g., a ceramic substrate) and conductor layers disposed on opposite surfaces of the insulator substrate, and the other of the first upper heat sink and the first lower heat sink is a conductor plate that is a conductor having higher thermal conductivity than the insulator substrate.

In the semiconductor device as described above, the laminated substrate is used for one of the first upper heat sink and the first lower heat sink which are opposed to each other with the first semiconductor element sandwiched therebetween, and the conductor plate is used for the other of the first upper heat sink and the first lower heat sink. The laminated substrate having the insulator substrate has a low linear coefficient of expansion, and is thus able to curb thermal deformation of the semiconductor device, and reduce stress generated in the semiconductor element. On the other hand, the conductor plate does not have the insulator substrate, such as a ceramic substrate, and is thus more excellent in terms of the thermal conductivity than the laminated substrate. Thus, according to the above arrangement, the laminated substrate can reduce stress generated in the first semiconductor element, and the conductor plate can assure heat dissipation capacity required by the first semiconductor element.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

In one form of this technology, the semiconductor device may further include an insulating sheet. The conductor plate has a first surface and a second surface that are in opposite sides of the conductor plate. The insulating sheet may be joined to the first surface which is located remoter from the first semiconductor element than the second surface. With this arrangement, the surface of the conductor plate electrically connected to the first semiconductor element is electrically insulated from external equipment (e.g., a cooler). With the insulating sheet thus integrated with the semiconductor device, the semiconductor device can be easily combined or assembled with the external equipment (e.g., a cooler).

In one form of this technology, the first upper heat sink may be a laminated substrate, and the first lower heat sink may be a conductor plate. This arrangement is useful when the area of the upper electrode of the first semiconductor element is smaller than the area of the lower electrode of the first semiconductor element. The area of the upper electrode of the first semiconductor element may smaller than the area of the lower electrode of the first semiconductor element. When the area of the upper electrode is smaller than that of the lower electrode, a larger amount of heat of the first semiconductor element is released from the lower electrode, than that from the upper electrode. Accordingly, the first lower heat sink connected to the lower electrode and formed from the conductor plate having excellent heat dissipation capacity can more effectively remove heat from the first semiconductor element, or cool the first semiconductor element.

In addition to or in place of the above forms, at least one wiring layer may be provided, in addition to the upper electrode, on an upper surface side of the first semiconductor element. In this case, too, it is useful that the first upper heat sink is the laminated substrate, and the first lower heat sink is the conductor plate. Since the laminated substrate having the insulator substrate has a low linear coefficient of expansion, the amount of deformation due to temperature change is relatively small. Accordingly, when the first upper heat sink connected to the upper electrode is the laminated substrate of which thermal deformation is small, the upper electrode is less likely or unlikely to be deformed, resulting in reduction of an influence on or damage to the wiring layer adjacent to the upper electrode.

In one form of the technology, the semiconductor device may further include a second semiconductor element having an upper electrode and a lower electrode, a second upper heat sink connected to the upper electrode of the second semiconductor element, and a second lower heat sink connected to the lower electrode of the second semiconductor element. The second lower heat sink may be opposed to the second upper heat sink such that the second semiconductor element is sandwiched between the second upper heat sink and the second lower heat sink. In this case, the second upper heat sink may be a laminated substrate having an insulator substrate and conductor layers disposed on opposite surfaces of the insulator substrate, and the second lower heat sink may be a conductor plate that is of a conductor having higher thermal conductivity than the insulator substrate of the second upper heat sink. The second lower heat sink may be electrically connected to the first upper heat sink via a joint part. The joint part may be integrated with the second lower heat sink that is the conductor plate, and may be joined to the first upper heat sink that is the laminated substrate, via a joint layer (e.g., a solder joint layer).

In the form as described above, the second lower heat sink is connected to the first upper heat sink, via the joint part. The arrangement in which the joint part is provided as an integral part of one of the first upper heat sink and the second lower heat sink is useful in production of the semiconductor device. In this case, the joint part is joined to the other of the first upper heat sink and the second lower heat sink, via the joint layer (e.g., a solder joint layer). To enhance the durability of the joint layer, it is useful to reduce stress generated in the joint layer. In this respect, the amount of deformation of the laminated substrate due to temperature change is smaller than that of the conductor plate. Accordingly, when the joint part is provided as an integral part of the second lower heat sink (i.e., the conductor plate), and the joint part is joined to the first upper heat sink (i.e., the laminated substrate), the stress generated in the joint layer can be reduced. In addition, the joint part can be more easily integrated with the second lower heat sink in the form of the conductor plate, as compared with the first upper heat sink in the form of the laminated substrate.

In another form of this technology, the first upper heat sink may be a conductor plate, and the first lower heat sink may be a laminated substrate. This arrangement can be useful when the area of the lower electrode of the first semiconductor element is larger than that of the upper electrode of the first semiconductor element. When the first upper heat sink and the first lower heat sink undergo thermal expansion, deformation (i.e., load) of these heat sinks is transferred from the upper electrode and lower electrode, respectively, to the first semiconductor element. At this time, when the area of the lower electrode is larger than that of the upper electrode, the first semiconductor element is more strongly influenced by deformation (i.e., load) transferred from the lower electrode. The area of the lower electrode of the first semiconductor element may be larger than that of the upper electrode of the first semiconductor element. When the area of the lower electrode is larger than that of the upper electrode, the laminated substrate of which thermal deformation is small is used for the first lower heat sink connected to the lower electrode, so that the load applied to the first semiconductor element (namely, stress of the semiconductor element due to the load) can be reduced.

In the above form, too, the semiconductor device may further include a second semiconductor element having an upper electrode and a lower electrode, a second upper heat sink connected to the upper electrode of the second semiconductor element, and a second lower heat sink connected to the lower electrode of the second semiconductor element. The second lower heat sink may be opposed to the second upper heat sink such that the second semiconductor element is sandwiched between the second upper heat sink and the second lower heat sink. In this case, the second lower heat sink may be a laminated substrate having an insulator substrate and conductor layers disposed on opposite surfaces of the insulator substrate, and the second upper heat sink may be a conductor plate that is a conductor having higher thermal conductivity than the insulator substrate of the second lower heat sink. The first upper heat sink may be electrically connected to the second lower heat sink via a joint part. The joint part may be integrated with the first upper heat sink that is the conductor plate, and may be joined to the second lower heat sink that is the laminated substrate, via a joint layer (e.g., a solder joint layer). With this arrangement, too, the joint part is provided as an integral part of the first upper heat sink in the form of the conductor plate, and the joint part is joined to the second lower heat sink in the form of the laminated substrate. Therefore, deformation applied to the joint layer (e.g., solder) between the joint part and the second lower heat sink can be reduced, whereby the durability of the joint layer can be enhanced.

In one form of this technology, the laminated substrate of the first upper heat sink or the first lower heat sink and the laminated substrate of the second upper heat sink or the second lower heat sink may constitute a single laminated substrate. Namely, the laminated substrate connected to the first semiconductor element and the laminated substrate connected to the second semiconductor element may constitute a single laminated substrate. However, in another form of the technology, the laminated substrate connected to the first semiconductor element and the laminated substrate connected to the second semiconductor element may be individual laminated substrates that are independent of each other.

First Embodiment

A semiconductor device 10 of a first embodiment will be described with reference to the drawings. The semiconductor device 10 of this embodiment, which is a power semiconductor device, may be used in a power conversion circuit, such as a converter or inverter, in an electricpowered vehicle, such as an electric vehicle, hybrid vehicle, or fuel cell vehicle. However, the semiconductor device 10 is not limited to any particular use or application. The semiconductor device 10 may be widely used in various apparatuses and circuits.

Figure 1:
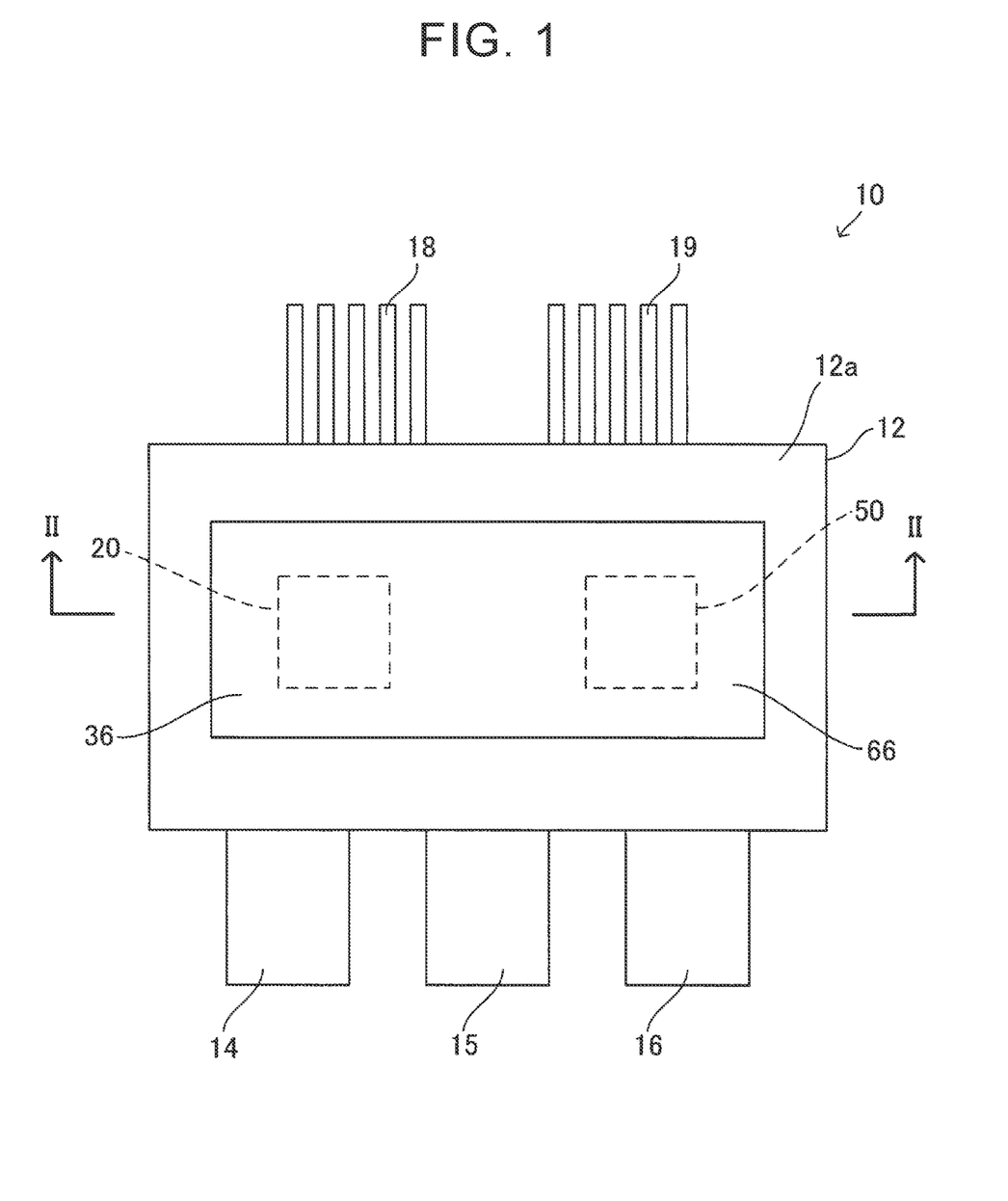
FIG. 1 is a plan view of a semiconductor device of a first embodiment.
Figure 2:
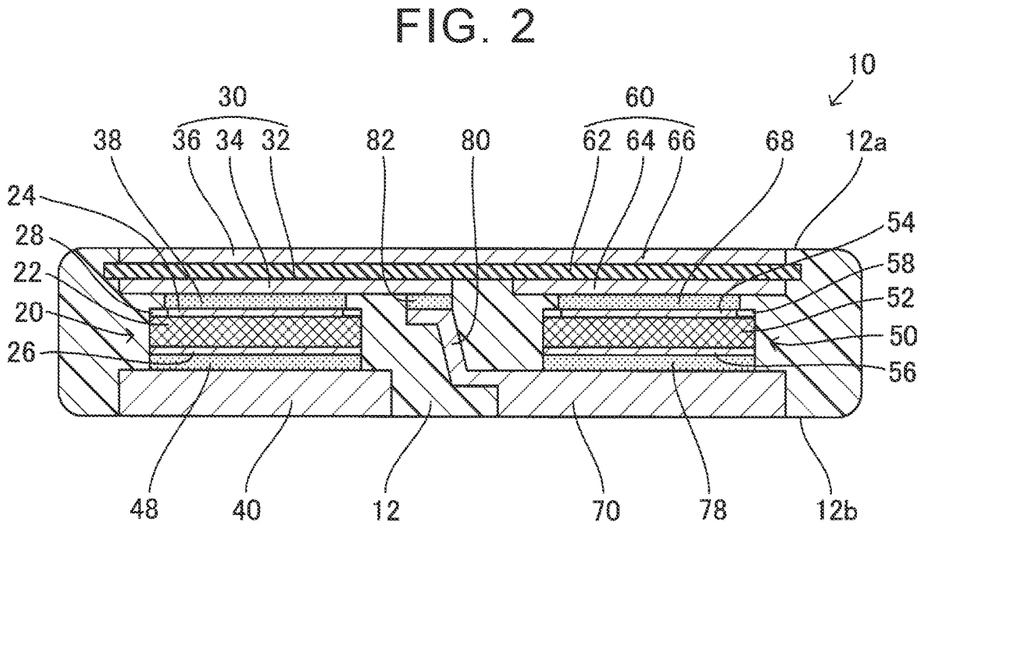
FIG. 2 is a cross-sectional view taken along line II-II in FIG. 1.

As shown in FIG. 1 and FIG. 2, the semiconductor device 10 includes a first semiconductor element 20, second semiconductor element 50, sealing body 12, and a plurality of terminals 14, IS, 16, 18, 19. The first semiconductor element 20 and the second semiconductor element 50 are encapsulated within the sealing body 12. The sealing body 12 is formed of a thermosetting resin, such as epoxy resin, though it is not limited to any particular material. Each of the terminals 14, 15, 16, 18, 19 extends from the outside of the sealing body 12 to the inside thereof, and is electrically connected to at least one of the first semiconductor element 20 and the second semiconductor element 50 within the sealing body 12. In one example, the terminals 14, 15, 16, 18, 19 include a P terminal 14, N terminal IS, and O terminal 16 for electric power, and a plurality of first signal terminals 18 and a plurality of second signal terminals 19 for signals.

The first semiconductor element 20 and the second semiconductor element 50 are power semiconductor elements, and have the same configuration. The first semiconductor element 20 has a semiconductor substrate 22, upper electrode 24, and lower electrode 26. The upper electrode 24 is provided on an upper surface of the semiconductor substrate 22, and the lower electrode 26 is provided on a lower surface of the semiconductor substrate 22. Namely, the first semiconductor element 20 is a vertical semiconductor element having the semiconductor substrate 22 sandwiched between a pair of electrodes 24, 26. The lower electrode 26 covers the entire area of the lower surface of the first semiconductor element 20, whereas the upper electrode 24 covers a part (more specifically, a range excluding a peripheral portion) of the upper surface of the first semiconductor element 20. Accordingly, the area of the upper electrode 24 is smaller than that of the lower electrode 26. The first semiconductor element 20 further includes a wiring layer 28 for signals. The wiring layer 28 is provided on the upper surface side of the first semiconductor element 20, along with the upper electrode 24. Although not illustrated in the drawings, the wiring layer 28 is located in an insulating film provided on the upper surface of the semiconductor substrate 22.

Similarly, the second semiconductor element 50 has a semiconductor substrate 52, upper electrode 54, and lower electrode 56. The upper electrode 54 is provided on an upper surface of the semiconductor substrate 52, and the lower electrode 56 is provided on a lower surface of the semiconductor substrate 52. The second semiconductor element 50 is also a vertical semiconductor element having the semiconductor substrate 52 sandwiched between a pair of electrodes 54, 56. The lower electrode 56 covers the entire area of the lower surface of the second semiconductor element 50, whereas the upper electrode 54 covers a part (more specifically, a range excluding a peripheral portion) of the upper surface of the second semiconductor element 50. Accordingly, the area of the upper electrode 54 is smaller than that of the lower electrode 56. The second semiconductor element 50 further includes a wiring layer 58 for signals. The wiring layer 58 is provided on the upper surface side of the second semiconductor element 50, along with the upper electrode 54. Although not illustrated in the drawings, the wiring layer 58 is located in an insulating film provided on the upper surface of the semiconductor substrate 52.

In one example, the first semiconductor element 20 and second semiconductor element 50 in this embodiment are metal-oxide semiconductor field-effect transistors (MOSFET). The semiconductor substrates 22, 52 are silicon carbide (SIC) substrates. However, the first semiconductor element 20 and second semiconductor element 50 may be selected from other types of power semiconductor elements, such as an insulated gate bipolar transistor (IGBT), and a reverse conducting IGBT (RC-IGBT). The material that forms the semiconductor substrates 22, 52 is not limited to silicon carbide, but may be selected from other semiconductors, such as silicon (Si) and nitride semiconductors. Each of the first semiconductor element 20 and the second semiconductor element 50 may be replaced with a combination of two or more semiconductor elements, for example, a combination of a diode and IGBT (or MOSFET).

The semiconductor device 10 further includes a first upper heat sink 30 and a first lower heat sink 40. The first upper heat sink 30 and the first lower heat sink 40 are opposed to each other such that the first semiconductor element 20 is sandwiched between the first upper heat sink 30 and the first lower heat sink 40. The first upper heat sink 30 is connected to the upper electrode 24 of the first semiconductor element 20, and is placed along an upper surface 12a of the sealing body 12. In one example, the first upper heat sink 30 is soldered to the upper electrode 24 of the first semiconductor element 20, and a solder joint layer 38 is formed between the first upper heat sink 30 and the upper electrode 24. The first lower heat sink 40 is connected to the lower electrode 26 of the first semiconductor element 20, and is placed along a lower surface 12b of the sealing body 12. In one example, the first lower heat sink 40 is soldered to the lower electrode 26 of the first semiconductor element 20, and a solder joint layer 48 is formed between the first lower heat sink 40 and the lower electrode 26.

The first upper heat sink 30 has an insulator substrate 32, inner conductor layer 34, and outer conductor layer 36. The inner conductor layer 34 is provided on an inner surface (lower surface in FIG. 2) of the insulator substrate 32, and the outer conductor layer 36 is provided on an outer surface (upper surface in FIG. 2) of the insulator substrate 32. Thus, the first upper heat sink 30 is a laminated substrate having the conductor layers 34, 36 on the opposite surfaces of the insulator substrate 32. The inner conductor layer 34 is joined to the upper electrode 24 of the first semiconductor element 20, via the solder joint layer 38. With this arrangement, the inner conductor layer 34 forms a part of an electric circuit connected to the first semiconductor element 20. The outer conductor layer 36 is exposed to the upper surface 12a of the sealing body 12, and dissipates heat of the first semiconductor element 20 to the outside. The first upper heat sink 30 of this embodiment, and a second upper heat sink 60 that will be described later, constitute a single laminated substrate.

In one example, a direct bonded copper (DBC) substrate is used, as one example of the laminated substrate, for the first upper heat sink 30 of this embodiment. Namely, the insulator substrate 32 is a ceramic substrate, and is formed of a ceramic material, such as aluminum nitride, or silicon nitride. Each of the inner conductor layer 34 and the outer conductor layer 36 is formed of copper (or a copper alloy). However, the first upper heat sink 30 is not limited to the DBC substrate. The insulator substrate 32 is not limited to ceramics, but may be formed of other insulators. The inner conductor layer 34 and the outer conductor layer 36 are not limited to copper, but may be formed of other metals, such as aluminum, or other conductors. Also, the joint structure between the insulator substrate 32 and each conductor layer 34, 36 is not limited to any particular structure.

The first lower heat sink 40 is a conductor plate formed of a conductor, and does not have an insulator substrate. The first lower heat sink 40 is formed of a conductor having higher thermal conductivity than the insulator substrate 32 of the first upper heat sink 30. In one example, a copper plate is used, as one example of the conductor plate, for the first lower heat sink 40 of this embodiment. However, the first lower heat sink 40 is not limited to the copper plate, but may be formed of other metals, such as aluminum, or other conductors. As described above, the first lower heat sink 40 is joined, via the solder joint layer 48, to the lower electrode 26 of the first semiconductor element 20. With this arrangement, the first lower heat sink 40 forms a part of an electric circuit connected to the first semiconductor element 20. The P terminal 14 shown in FIG. 1 is connected to the first lower heat sink 40.

The semiconductor device 10 further includes a second upper heat sink 60 and a second lower heat sink 70. The second upper heat sink 60 and the second lower heat sink 70 are opposed to each other, such that the second semiconductor element 50 is sandwiched between the second upper heat sink 60 and the second lower heat sink 70. The second upper heat sink 60 is connected to the upper electrode 54 of the second semiconductor element 50, and is exposed to the upper surface 12a of the sealing body 12. In one example, the second upper heat sink 60 is soldered to the upper electrode 54 of the second semiconductor element 50, and a solder joint layer 68 is formed between the second upper heat sink 60 and the upper electrode 54. The second lower heat sink 70 is connected to the lower electrode 56 of the second semiconductor element 50, and is exposed to the lower surface 12b of the sealing body 12. In one example, the second lower heat sink 70 is soldered to the lower electrode 56 of the second semiconductor element 50, and a solder joint layer 78 is formed between the second lower heat sink 70 and the lower electrode 56.

The second upper heat sink 60 has an insulator substrate 62, inner conductor layer 64, and outer conductor layer 66. The inner conductor layer 64 is provided on an inner surface (lower surface in FIG. 2) of the insulator substrate 62, and the outer conductor layer 66 is provided on an outer surface (upper surface in FIG. 2) of the insulator substrate 62. Thus, the second upper heat sink 60 is a laminated substrate having the conductor layers 64, 66 on the opposite surfaces of the insulator substrate 62. The inner conductor layer 64 is joined to the upper electrode 54 of the second semiconductor element 50, via the solder joint layer 68. With this arrangement, the inner conductor layer 64 forms a part of an electric circuit connected to the second semiconductor element 50. The N terminal 15 shown in FIG. 1 is connected to the inner conductor layer 64. The outer conductor layer 66 is exposed to the upper surface 12a of the sealing body 12, and dissipates heat of the second semiconductor element 50 to the outside.

As described above, the second upper heat sink 60 and the above first upper heat sink 30 constitute a single laminated substrate. Accordingly, a DBC substrate is used for the second upper heat sink 60 of this embodiment, like the first upper heat sink 30. However, the second upper heat sink 60 is also not limited to the DBC substrate, but various types of laminated substrates may be used. The insulator substrate 32 of the first upper heat sink 30 and the insulator substrate 62 of the second upper heat sink 60 constitute a single insulator substrate (e.g., a ceramic substrate), and are continuously formed with no boundary therebetween. Similarly, the outer conductor layer 36 of the first upper heat sink 30 and the outer conductor layer 66 of the second upper heat sink 60 constitute a single conductor layer, and are continuously formed with no boundary therebetween. On the other hand, the inner conductor layer 34 of the first upper heat sink 30 and the inner conductor layer 64 of the second upper heat sink 60 provide conductor regions that are independent of each other, and are insulated from each other on the insulator substrates 32, 62. In another embodiment, the first upper heat sink 30 and the second upper heat sink 60 may be provided by individual laminated substrates (see FIG. 7, for example) that are independent of each other.

The second lower heat sink 70 is a conductor plate formed of a conductor, and does not have an insulator substrate. The second lower heat sink 70 is formed of a conductor having higher thermal conductivity than the insulator substrate 62 of the second upper heat sink 60. In one example, a copper plate is used, as one example of the conductor plate, for the second lower heat sink 70 of this embodiment. However, the second lower heat sink 70 is not limited to the copper plate, but may be formed of other metals, such as aluminum, or other conductors. As described above, the second lower heat sink 70 is joined to the lower electrode 56 of the second semiconductor element 50, via the solder joint layer 78. With this arrangement, the second lower heat sink 70 forms a part of an electric circuit connected to the second semiconductor element 50. The O terminal 16 shown in FIG. 1 is connected to the second lower heat sink 70.

The second lower heat sink 70 is connected to the inner conductor layer 34 of the first upper heat sink 30, via a joint part 80. Thus, the first semiconductor element 20 and the second semiconductor element 50 are connected in series via the joint part 80. The joint part 80 is formed integrally with the second lower heat sink 70 in the form of the conductor plate, and is also joined to the inner conductor layer 34 of the first upper heat sink 30 in the form of the laminated substrate, via a solder joint layer 82. However, the solder joint layer 82 is not limitedly formed of solder, but may be formed of other materials.

As described above, in the semiconductor device 10 of this embodiment, the laminated substrate having the insulator substrate 32 is used for one of the first upper heat sink 30 and the first lower heat sink 40 which are opposed to each other with the first semiconductor element 20 sandwiched therebetween. Then, the conductor plate formed of a conductor having higher thermal conductivity than the insulator substrate 32 is used for the other of the above-indicated heat sinks 30, 40. The laminated substrate (i.e., the first upper heat sink 30) having the insulator substrate 32, which has a low linear coefficient of expansion, makes it possible to curb thermal expansion of the semiconductor device 10, and reduce stress generated in the first semiconductor element 20. On the other hand, the first lower heat sink 40 formed from the conductor plate has excellent thermal conductivity, and is thus able to release a larger amount of heat of the first semiconductor element 20 to the outside. Thus, according to the arrangement of this embodiment, the first upper heat sink 30 (i.e., the laminated substrate) serves to curb thermal deformation of the semiconductor device 10, and reduce stress generated in the first semiconductor element 20, while at the same time the first lower heat sink 40 (i.e., the conductor plate) assures heat dissipation capacity required by the first semiconductor element 20.

Similarly, in the second semiconductor element 50, too, the laminated substrate having the insulator substrate 62 is used for one of the second upper heat sink 60 and the second lower heat sink 70, and the conductor plate formed of a conductor having higher thermal conductivity than the insulator substrate 62 is used for the other of the above-indicated heat sinks 60, 70. Thus, according to the arrangement of this embodiment, the second upper heat sink 60 (i.e., the laminated substrate) serves to curb thermal expansion of the semiconductor device 10, and reduce stress generated in the second semiconductor element 50, and the second lower heat sink 70 (i.e., the conductor plate) assures heat dissipation capacity required by the second semiconductor element 50. In another embodiment, the semiconductor device 10 may not include the second semiconductor element 50. In a further embodiment, the semiconductor device 10 may include three or more semiconductor elements, including the first semiconductor element 20 and the second semiconductor element 50. The number of semiconductor elements included in the semiconductor device 10 is not limited to any particular number. When the semiconductor device 10 includes two or more semiconductor elements, the technology disclosed in this embodiment (namely, the combination of the laminated substrate and the conductor plate) can be employed, with respect to at least one of the two or more semiconductor elements.

In the semiconductor device 10 of this embodiment, the first upper heat sink 30 is the laminated substrate, and the first lower heat sink 40 is the conductor plate. This arrangement is useful, when the area of the upper electrode 24 of the first semiconductor element 20 is smaller than that of the lower electrode 26 of the first semiconductor element 20. When the area of the upper electrode 24 is smaller than that of the lower electrode 26, a larger amount of heat of the first semiconductor element 20 is released from the lower electrode 26, rather than the upper electrode 24. In this respect, the first lower heat sink 40 in the form of the conductor plate does not have the insulator substrate, such as a ceramic substrate, and is thus more excellent in terms of the thermal conductivity than the first upper heat sink 30. Accordingly, the first lower heat sink 40 connected to the lower electrode 26 can more effectively remove heat from the first semiconductor element 20 or cool the first semiconductor element 20, since it is a conductor plate having an excellent heat dissipation property. This point also applies to the second semiconductor element 50.

In addition, at least one wiring layer 28, as well as the upper electrode 24, is provided on the upper surface side of the first semiconductor element 20. In this respect, too, it is useful that the first upper heat sink 30 is the laminated substrate, and the first lower heat sink 40 is the conductor plate. Since the laminated substrate having the insulator substrate has a low linear coefficient of expansion, the amount of deformation due to temperature change is relatively small. Thus, since the first upper heat sink 30 connected to the upper electrode 24 is the laminated substrate of which thermal deformation is small, the upper electrode 24 is less likely or unlikely to be deformed, and an influence on or damage to the wiring layer 28 adjacent to the upper electrode 24 is also reduced.

In the semiconductor device 10 of this embodiment, the second lower heat sink 70 is connected to the first upper heat sink 30, via the joint part 80. The joint part 80 is provided as an integral part of the second lower heat sink 70, and is joined to the inner conductor layer 34 of the first upper heat sink 30, via the solder joint layer 82. It is useful to curb stress generated in the solder joint layer 82, so as to enhance the durability of the solder joint layer 82. In this respect, since the first upper heat sink 30 is the laminated substrate having the insulator substrate 32, the amount of deformation due to temperature change is smaller, as compared with the second lower heat sink 70 in the form of the conductor plate. Accordingly, stress generated in the solder joint layer 82 can be reduced, with the arrangement in which the joint part 80 is provided as an integral part of the second lower heat sink 70 (i.e., the conductor plate), and the joint part 80 is joined to the first upper heat sink 30 (i.e., the laminated substrate). In addition, the second lower heat sink 70 in the form of the conductor plate is more easily formed integrally with the joint part 80, as compared with the first upper heat sink 30 in the form of the laminated substrate.

Second Embodiment

Figure 3:
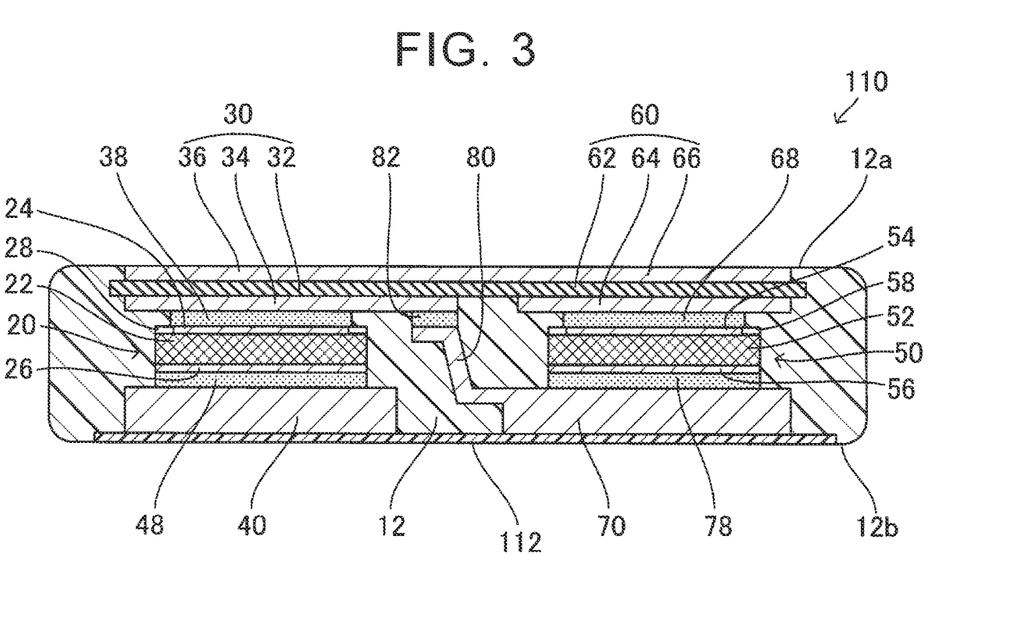
FIG. 3 is a cross-sectional view of a semiconductor device of a second embodiment.

Referring to FIG. 3, a semiconductor device 110 of a second embodiment will be described. The semiconductor device 110 of this embodiment is different from the semiconductor device 10 of the first embodiment in that the semiconductor device 110 further includes an insulating sheet 112. The other configuration of the semiconductor device 110 of this embodiment is substantially identical with that of the semiconductor device 10 of the first embodiment, and therefore, will not be repeatedly described herein. Basically, the same reference numerals are assigned to the same or corresponding components of the first and second embodiments.

The insulating sheet 112 is provided along the lower surface 12b of the sealing body 12, and covers a lower surface (i.e., one of opposite surfaces located remoter from the first semiconductor element 20 than the other surface) of the first lower heat sink 40, and a lower surface (i.e., one of opposite surfaces located remoter from the second semiconductor element 50 than the other surface) of the second lower heat sink 70. With this arrangement, the lower surface of the first lower heat sink 40 electrically connected to the first semiconductor element 20, and the lower surface of the second lower heat sink 70 electrically connected to the second semiconductor element 50 are electrically insulated from external equipment (such as a cooler). With the insulating sheet 112 thus integrated with the semiconductor device 110, the semiconductor device 110 can be easily combined or assembled with the external equipment (such as a cooler).

The insulating sheet 112 of this embodiment is formed of a resin material having insulation properties. The material that forms the insulating sheet 112 is only required to be an insulating material, and is not limited to any particular material. The insulating sheet 112 is not required to be provided on the upper surface 12a of the sealing body 12, because the exposed outer conductor layers 36, 66 are insulated from the semiconductor elements 20, 50 by the insulator substrates 32, 62. Thus, in one example of production of the semiconductor device 110, the upper surface 12a of the sealing body 12 is ground, after the sealing body 12 is formed with a mold, so that the outer conductor layers 36, 66 can be exposed to the outside, and the thickness of the semiconductor device 110 can be adjusted.

Third Embodiment

Figure 4:
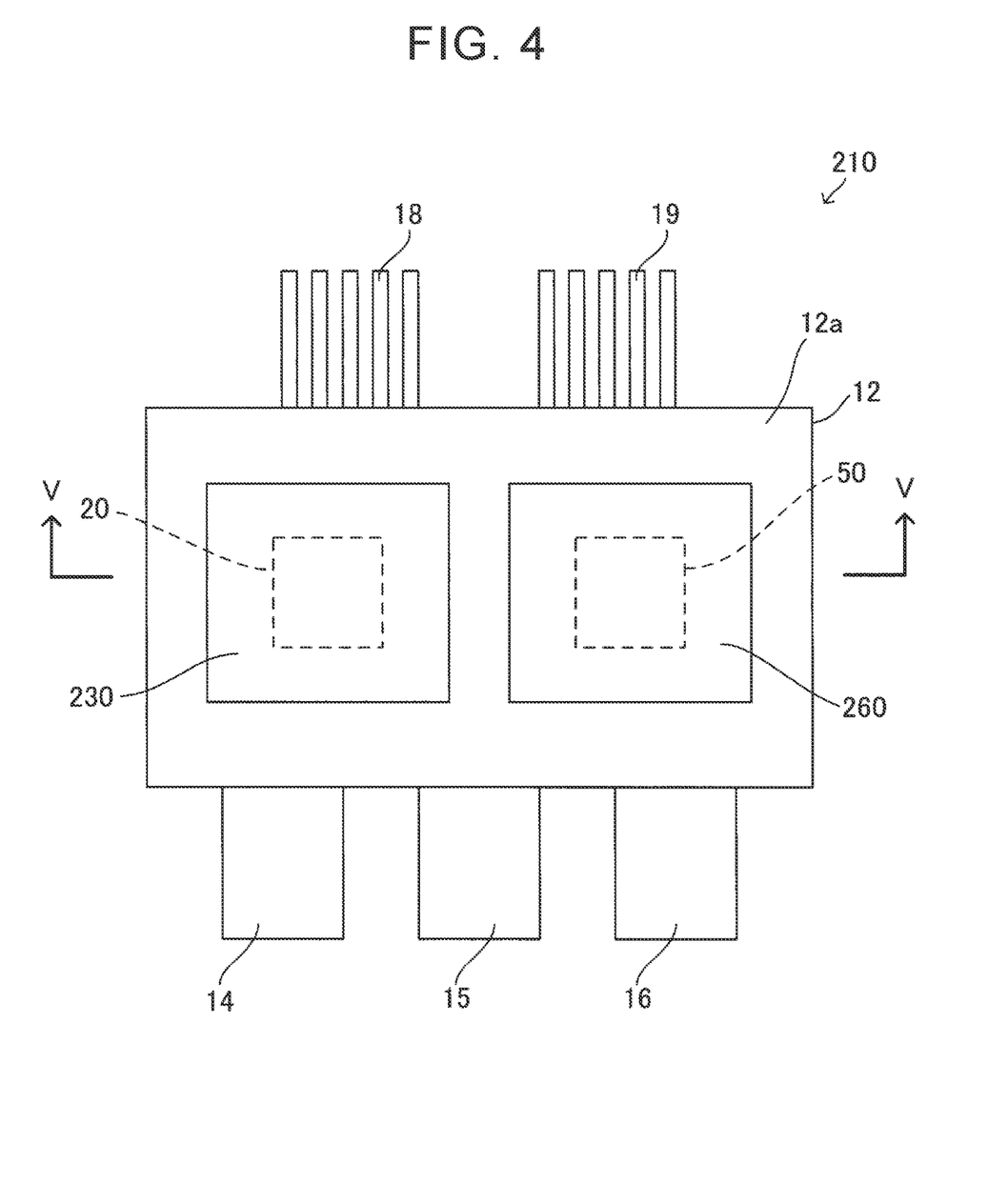
FIG. 4 is a plan view of a semiconductor device of a third embodiment.
Figure 5:
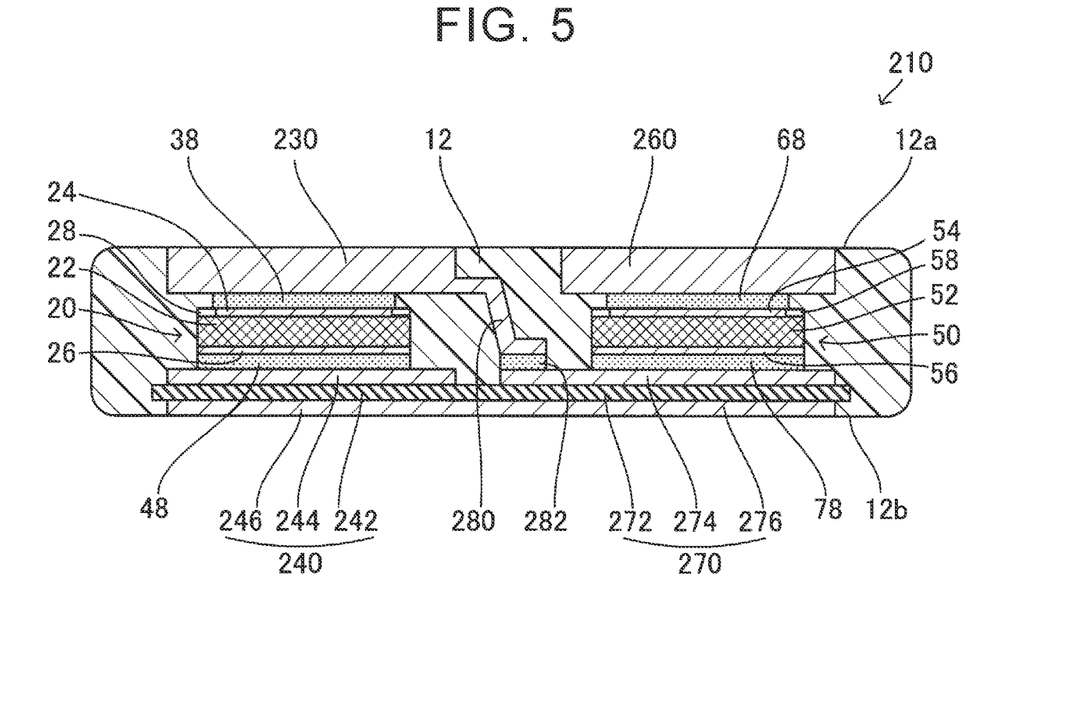
FIG. 5 is a cross-sectional view taken along line V-V in FIG. 4.

Referring to FIG. 4 and FIG. 5, a semiconductor device 210 of a third embodiment will be described. In the semiconductor device 210 of this embodiment, conductor plates are used for a first upper heat sink 230 and a second upper heat sink 260, and laminated substrates are used for a first lower heat sink 240 and a second lower heat sink 270. In addition, a joint part 280 is formed integrally with the first upper heat sink 230, and is also joined to an inner conductor layer 274 of the second lower heat sink 270 via a solder joint layer 282. In these points, the semiconductor device 210 of the third embodiment is different from the semiconductor device 10 of the first embodiment. The other configuration of the semiconductor device 210 of this embodiment is substantially identical with that of the semiconductor device 10 of the first embodiment, and therefore, will not be repeatedly described. Basically, the same reference numerals are assigned to the same or corresponding components of the first and third embodiments.

The first upper heat sink 230 is a conductor plate formed of a conductor, and does not have an insulator substrate. The first upper heat sink 230 is formed of a conductor having higher thermal conductivity than an insulator substrate 242 of the first lower heat sink 240 which will be described later. In one example, a copper plate is used, as one example of the conductor plate, for the first upper heat sink 230 of this embodiment. However, the first upper heat sink 230 is not limited to the copper plate, but may be formed of other metals, such as aluminum, or other conductors. The first upper heat sink 230 is joined to the upper electrode 24 of the first semiconductor element 20, via the solder joint layer 38. With this arrangement, the first upper heat sink 230 forms a part of an electric circuit connected to the first semiconductor element 20.

The first lower heat sink 240 has the insulator substrate 242, an inner conductor layer 244, and an outer conductor layer 246. The inner conductor layer 244 is provided on an inner surface (upper surface in FIG. 5) of the insulator substrate 242, and the outer conductor layer 246 is provided on an outer surface (lower surface in FIG. 5) of the insulator substrate 242. Thus, the first lower heat sink 240 is a laminated substrate having the conductor layers 244, 246 on the opposite surfaces of the insulator substrate 242. The inner conductor layer 244 is joined to the lower electrode 26 of the first semiconductor element 20, via the solder joint layer 48. With this arrangement, the inner conductor layer 244 forms a part of an electric circuit connected to the first semiconductor element 20. The P terminal 14 shown in FIG. 4 is connected to the inner conductor layer 244.

The outer conductor layer 246 of the first lower heat sink 240 is exposed to the lower surface 12b of the sealing body 12, and dissipates heat of the first semiconductor element 20 to the outside. The first lower heat sink 240 of this embodiment and the second lower heat sink 270 that will be described later constitute a single laminated substrate. In one example, a direct bonded copper (DBC) substrate is used, as one example of the laminated substrate, for the first lower heat sink 240 of this embodiment. However, the laminated substrate used for the first lower heat sink 240 is not limited to the DBC substrate, or any other particular laminated substrate.

The second upper heat sink 260 is a conductor plate formed of a conductor, and does not have an insulator substrate. The second upper heat sink 260 is formed of a conductor having higher thermal conductivity than an insulator substrate 272 of the second lower heat sink 270 which will be described later. In one example, a copper plate is used, as one example of the conductor plate, for the second upper heat sink 260 of this embodiment. However, the second upper heat sink 260 is not limited to the copper plate, but may be formed of other metals, such as aluminum, or other conductors. The second upper heat sink 260 is joined to the upper electrode 54 of the second semiconductor element 50, via the solder joint layer 68. With this arrangement, the second upper heat sink 260 forms a part of an electric circuit connected to the second semiconductor element 50. The N terminal 15 shown in FIG. 4 is connected to the second upper heat sink 260.

The second lower heat sink 270 has the insulator substrate 272, an inner conductor layer 274, and an outer conductor layer 276. The inner conductor layer 274 is provided on an inner surface (upper surface in FIG. 5) of the insulator substrate 272, and the outer conductor layer 276 is provided on an outer surface (lower surface in FIG. 5) of the insulator substrate 272. Thus, the second lower heat sink 270 is a laminated substrate having the conductor layers 274, 276 on the opposite surfaces of the insulator substrate 272. The inner conductor layer 274 is joined to the lower electrode 56 of the second semiconductor element 50, via the solder joint layer 78. With this arrangement, the inner conductor layer 274 forms a part of an electric circuit connected to the second semiconductor element 50. The O terminal 16 shown in FIG. 4 is connected to the inner conductor layer 274. The outer conductor layer 276 is exposed to the lower surface 12b of the sealing body 12, and dissipates heat of the second semiconductor element 50 to the outside.

As described above, the second lower heat sink 270 and the first lower heat sink 240 as described above constitute a single laminated substrate. Accordingly, a DBC substrate is used for the second lower heat sink 270 of this embodiment, like the first lower heat sink 240. However, the second lower heat sink 270 is not limited to the DBC substrate, but various types of laminated substrates may be used. In one example, the insulator substrate 242 of the first lower heat sink 240 and the insulator substrate 272 of the second lower heat sink 270 constitute a single insulator substrate (e.g., a ceramic substrate), and are continuously formed with no boundary therebetween. Similarly, the outer conductor layer 246 of the first lower heat sink 240 and the outer conductor layer 276 of the second lower heat sink 270 constitute a single conductor layer, and are continuously formed with no boundary therebetween. On the other hand, the inner conductor layer 244 of the first lower heat sink 240, and the inner conductor layer 274 of the second lower heat sink 270 provide conductor regions that are independent of each other, and are insulated from each other on the insulator substrates 242, 272. In another embodiment, the first lower heat sink 240 and the second lower heat sink 270 may be provided by individual laminated substrates that are independent of each other (see FIG. 8, for example).

In the semiconductor device 210 of this embodiment, too, the laminated substrate having the insulator substrate 242 is used for one of the first upper heat sink 230 and the first lower heat sink 240 that are opposed to each other with the first semiconductor element 20 sandwiched therebetween. Then, the conductor plate formed of a conductor having higher thermal conductivity than the insulator substrate 242 is used for the other of the first upper heat sink 230 and the first lower heat sink 240. With the arrangement of this embodiment, too, the first lower heat sink 240 (i.e., the laminated substrate) serves to curb thermal deformation of the semiconductor device 10, and reduce stress generated in the first semiconductor element 20, while at the same time the first upper heat sink 230 (i.e., the conductor plate) assures heat dissipation capacity required by the first semiconductor element 20.

In the semiconductor device 210 of this embodiment, the conductor plate is used for the first upper heat sink 230, and the laminated substrate is used for the first lower heat sink 240, based on another aspect of this technology. This arrangement is useful when the area of the lower electrode 26 of the first semiconductor element 20 is larger than that of the upper electrode 24 of the first semiconductor element 20. When the first upper heat sink 230 and the first lower heat sink 240 thermally expand, deformation (i.e., load) of these heat sinks 230, 240 are transferred from the upper electrode 24 and the lower electrode 26, respectively, to the first semiconductor element 20. At this time, if the area of the lower electrode 26 is larger than that of the upper electrode 24, the first semiconductor element 20 is more strongly influenced by deformation (i.e., load) transferred from the lower electrode 26. Thus, when the area of the lower electrode 26 is larger than that of the upper electrode 24, the laminated substrate of which thermal deformation is small is used for the first lower heat sink 240 connected to the lower electrode 26, so that the load applied to the first semiconductor element 20 (namely, stress of the first semiconductor element 20 due to the load) can be reduced. This also applies to the second semiconductor element 50, as is apparent from the above description, and thus, repeated description will not be provided.

In the semiconductor device 210 of this embodiment, too, the second lower heat sink 270 is connected to the first upper heat sink 230, via the joint part 280. In this embodiment, however, the joint part 280 is provided as an integral part of the first upper heat sink 230, and is joined to the inner conductor layer 274 of the second lower heat sink 270, via the solder joint layer 282. As described above, it is useful to curb or reduce stress generated in the solder joint layer 282, so as to enhance the durability of the solder joint layer 282. In this respect, since the second lower heat sink 270 is the laminated substrate having the insulator substrate 272, the amount of deformation due to temperature change is smaller, as compared with the first upper heat sink 230 in the form of the conductor plate. Accordingly, stress generated in the solder joint layer 282 can be reduced, with the arrangement in which the joint part 280 is provided as an integral part of the first upper heat sink 230 (i.e., the conductor plate), and the joint part 280 is joined to the second lower heat sink 270 (i.e., the laminated substrate). In addition, the first upper heat sink 230 in the form of the conductor plate is more easily formed integrally with the joint part 280, as compared with the second lower heat sink 270 in the form of the laminated substrate.

Fourth Embodiment

Figure 6:
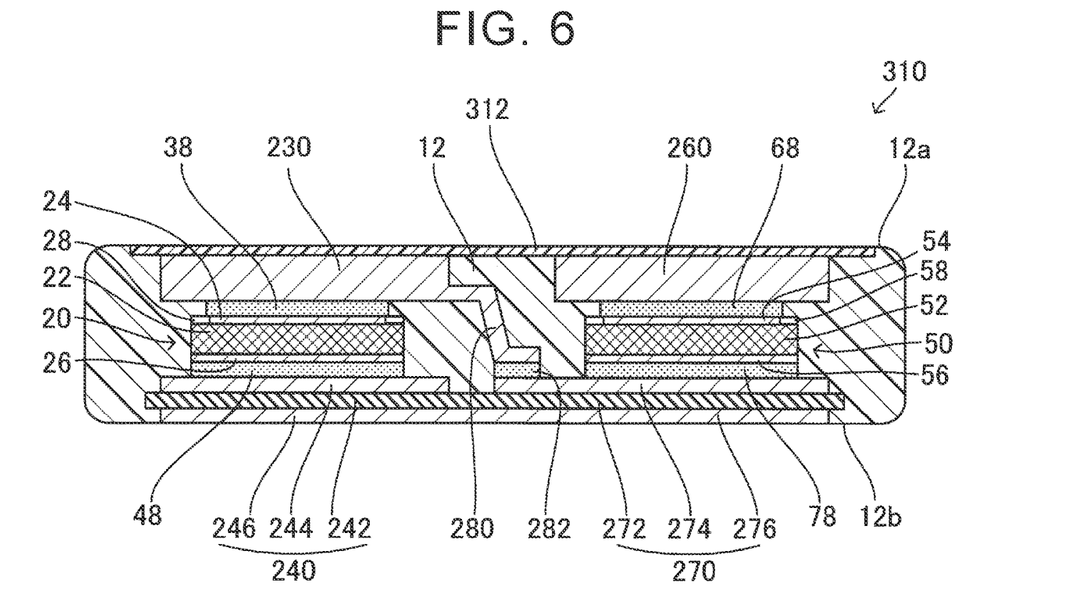
FIG. 6 is a cross-sectional view of a semiconductor device of a fourth embodiment.

Referring to FIG. 6, a semiconductor device 310 of a fourth embodiment will be described. The semiconductor device 310 of this embodiment is different from the semiconductor device 210 of the third embodiment in that the semiconductor device 310 further includes an insulating sheet 312. The other configuration of the semiconductor device 310 of this embodiment is substantially identical with that of the semiconductor device 210 of the third embodiment, and therefore, will not be repeatedly described. Basically, the same reference numerals are assigned to the same or corresponding components of the third and fourth embodiments.

The insulating sheet 312 is provided along the upper surface 12a of the sealing body 12, and covers an upper surface (i.e., one of opposite surfaces located remoter from the first semiconductor element 20 than the other surface) of the first upper heat sink 230, and an upper surface (i.e., one of opposite surfaces located remoter from the second semiconductor element 50 than the other surface) of the second upper heat sink 260. With this arrangement, the upper surface of the first upper heat sink 230 electrically connected to the first semiconductor element 20, and the upper surface of the second upper heat sink 260 electrically connected to the second semiconductor element 50 are electrically insulated from external equipment (such as a cooler). With the insulating sheet 312 thus integrated with the semiconductor device 310, the semiconductor device 310 can be easily combined or assembled with the external equipment (such as a cooler).

The insulating sheet 312 of this embodiment is formed of a resin material having insulation properties. However, the material that forms the insulating sheet 312 is only required to be an insulating material, and is not limited to any particular material. The insulating sheet 312 is not required to be provided on the lower surface 12b of the sealing body 12, because the exposed outer conductor layers 246, 276 are insulated from the semiconductor elements 20, 50 by the insulator substrates 242, 272. Thus, in one example of production of the semiconductor device 310, the lower surface 12b of the sealing body 12 is ground, after the sealing body 12 is formed with a mold, so that the outer conductor layers 246, 276 can be exposed to the outside, and the thickness of the semiconductor device 310 can be adjusted.

Fifth Embodiment

Figure 7:
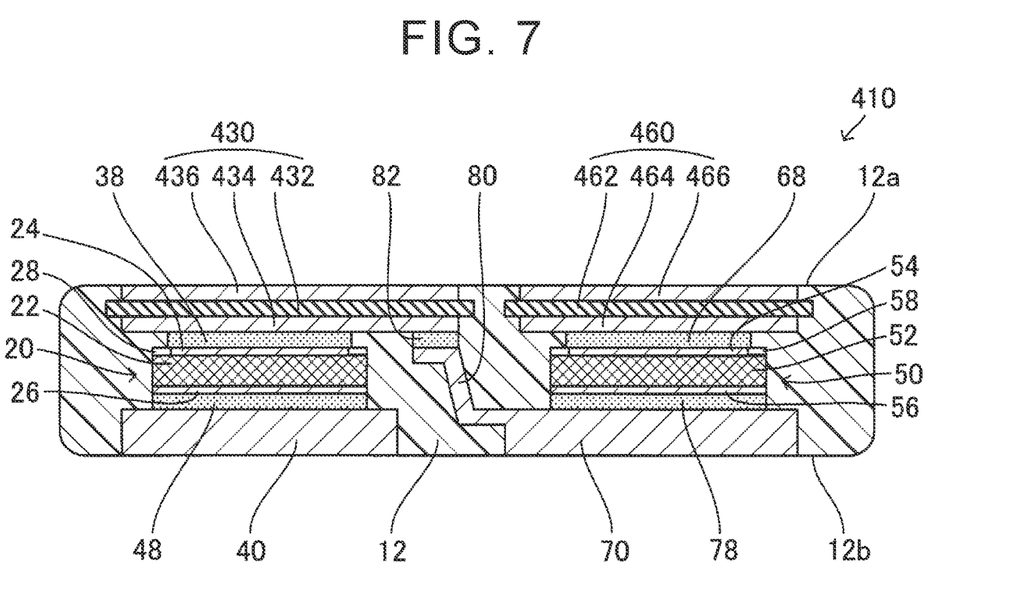
FIG. 7 is a cross-sectional view of a semiconductor device of a fifth embodiment.

Referring to FIG. 7, a semiconductor device 410 of a fifth embodiment will be described. In the semiconductor device 410 of this embodiment, a first upper heat sink 430 and a second upper heat sink 460 are provided by individual laminated substrates that are independent of each other, and the semiconductor device 410 is different from the semiconductor device 10 of the first embodiment in this respect. The other configuration of the semiconductor device 410 of this embodiment is substantially identical with that of the semiconductor device 10 of the first embodiment, and therefore, will not be repeatedly described. Basically, the same reference numerals are assigned to the same or corresponding components of the first and fifth embodiments.

The first upper heat sink 430 has an insulator substrate 432, inner conductor layer 434, and outer conductor layer 436. The inner conductor layer 434 is provided on an inner surface (lower surface in FIG. 7) of the insulator substrate 432, and the outer conductor layer 436 is provided on an outer surface (upper surface in FIG. 7) of the insulator substrate 432. Similarly, the second upper heat sink 460 has an insulator substrate 462, inner conductor layer 464, and outer conductor layer 466. The inner conductor layer 464 is provided on an inner surface (lower surface in FIG. 7) of the insulator substrate 462, and the outer conductor layer 466 is provided on an outer surface (upper surface in FIG. 7) of the insulator substrate 462. In this embodiment, DBC substrates are used for the first upper heat sink 430 and the second upper heat sink 460. However, the first upper heat sink 430 and the second upper heat sink 460 are not limited to the DBC substrates, but various types of laminated substrates may be used.

In the semiconductor device 410 of this embodiment, the first upper heat sink 430 and the second upper heat sink 460 are provided by individual laminated substrates that are independent of each other, therefore, the size (area) of each of the laminated substrates can be made relatively small. Thus, when the semiconductor device 410 deforms in response to temperature change, stress generated in the first upper heat sink 430 and the second upper heat sink 460 can be reduced. With the stress generated in the first upper heat sink 430 and the second upper heat sink 460 thus reduced, it is possible to avoid or reduce damages (in particular, fracture of the insulator substrates 432, 462 that are relatively brittle) in the first upper heat sink 430 and the second upper heat sink 460.

Sixth Embodiment

Figure 8:
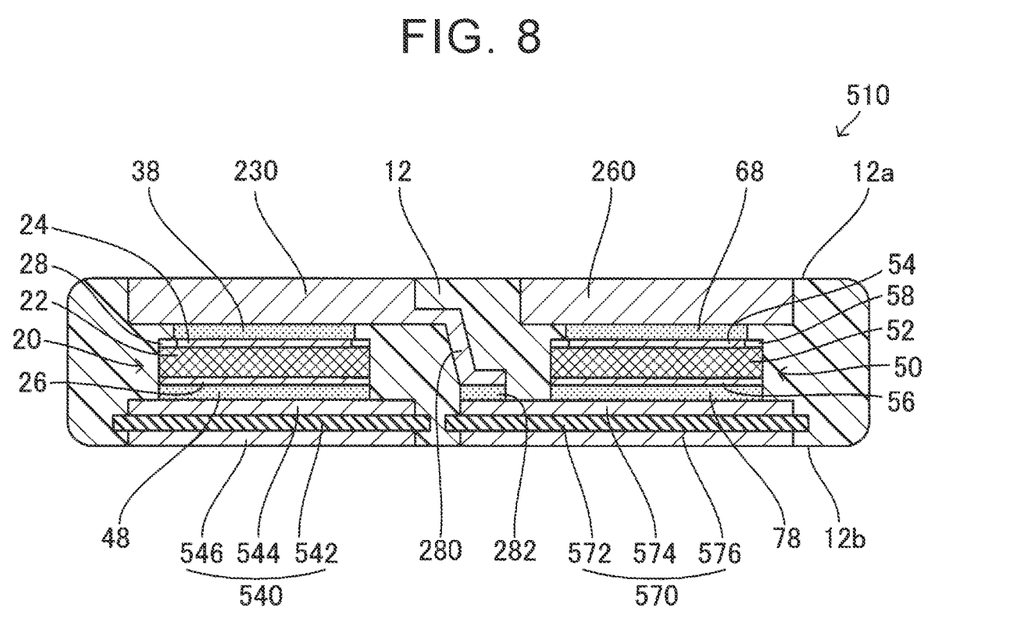
FIG. 8 is a cross-sectional view of a semiconductor device of a sixth embodiment.

Referring to FIG. 8, a semiconductor device 510 of a sixth embodiment will be described. In the semiconductor device 510 of this embodiment, a first lower heat sink 540 and a second lower heat sink 570 are provided by individual laminated substrates that are independent of each other, and the semiconductor device 510 is different from the semiconductor device 210 of the third embodiment in this point. The other configuration of the semiconductor device 510 of this embodiment is substantially identical with that of the semiconductor device 210 of the third embodiment, and therefore, will not be repeatedly described herein. Basically, the same reference numerals are assigned to the same or corresponding components of the third embodiment and sixth embodiment.

The first lower heat sink 540 has an insulator substrate 542, inner conductor layer 544, and outer conductor layer 546. The inner conductor layer 544 is provided on an inner surface (upper surface in FIG. 8) of the insulator substrate 542, and the outer conductor layer 546 is provided on an outer surface (lower surface in FIG. 8) of the insulator substrate 542. Similarly, the second lower heat sink 570 has an insulator substrate 572, inner conductor layer 574, and outer conductor layer 576. The inner conductor layer 574 is provided on an inner surface (upper surface in FIG. 8) of the insulator substrate 572, and the outer conductor layer 576 is provided on an outer surface (lower surface in FIG. 8) of the insulator substrate 572. In this embodiment, DBC substrates are used for the first lower heat sink 540 and the second lower heat sink 570. However, the first lower heat sink 540 and second lower heat sink 570 are not limited to the DBC substrate, but various types of laminated substrates may be used.

In the semiconductor device 510 of this embodiment, the first lower heat sink 540 and the second lower heat sink 570 are provided by individual laminated substrates that are independent of each other; therefore, the size (area) of each of the laminated substrates can be made relatively small. Thus, when the semiconductor device 510 deforms in response to temperature change, stress generated in the first lower heat sink 540 and the second lower heat sink 570 can be reduced. With the stress generated in the first lower heat sink 540 and second lower heat sink 570 thus reduced, it is possible to avoid or reduce damages (in particular, fracture of the insulator substrates 542, 572 that are relatively brittle) in the first lower heat sink 540 and the second lower heat sink 570.

While some specific examples have been described in detail, these examples are provided for illustrative purposes only, and are not intended to limit the appended claims. The technologies described in the claims include those obtained by modifying or changing the illustrated specific examples in various manners. The technology elements described in this specification or drawings exhibit technical usefulness when they are used alone or in combination.

What is claimed is:

1. A semiconductor device, comprising:
 a first semiconductor element having an upper electrode and a lower electrode;
 a first upper heat sink connected to the upper electrode; and
 a first lower heat sink connected to the lower electrode, the first lower heat sink being opposed to the first upper heat sink such that the first semiconductor element is sandwiched between the first upper heat sink and the first lower heat sink,
 wherein one of the first upper heat sink and the first lower heat sink is a laminated substrate having an insulator substrate and conductor layers disposed on opposite surfaces of the insulator substrate, and the other of the first upper heat sink and the first lower heat sink is a conductor plate that is a conductor having higher thermal conductivity than the insulator substrate.

2. The semiconductor device according to claim 1, further comprising an insulating sheet,
 wherein the conductor plate has a first surface and a second surface that are in opposite sides of the conductor plate, and the insulating sheet is joined to the first surface which is located remoter from the first semiconductor element than the second surface.

3. The semiconductor device according to claim 1, wherein the first upper heat sink is the laminated substrate, and the first lower heat sink is the conductor plate.

4. The semiconductor device according to claim 3, wherein an area of the upper electrode of the first semiconductor element is smaller than an area of the lower electrode of the first semiconductor element.

5. The semiconductor device according to claim 3, wherein at least one wiring layer is provided, in addition to the upper electrode, on an upper surface side of the first semiconductor element.

6. The semiconductor device according to claim 3, further comprising:
 a second semiconductor element having an upper electrode and a lower electrode;
 a second upper heat sink connected to the upper electrode of the second semiconductor element; and
 a second lower heat sink connected to the lower electrode of the second semiconductor element, the second lower heat sink being opposed to the second upper heat sink such that the second semiconductor element is sandwiched between the second upper heat sink and the second lower heat sink, wherein
 the second upper heat sink is a laminated substrate having an insulator substrate and conductor layers disposed on opposite surfaces of the insulator substrate, and the second lower heat sink is a conductor plate that is a conductor having higher thermal conductivity than the insulator substrate of the second upper heat sink,
 the second lower heat sink is electrically connected to the first upper heat sink via a joint part, and
 the joint part is integrated with the second lower heat sink that is the conductor plate, and is joined to the first upper heat sink that is the laminated substrate, via a joint layer.

7. The semiconductor device according to claim 6, wherein the laminated substrate of the first upper heat sink and the laminated substrate of the second upper heat sink constitute a single laminated substrate.

8. The semiconductor device according to claim 1, wherein the first upper heat sink is the conductor plate, and the first lower heat sink is the laminated substrate.

9. The semiconductor device according to claim 8, wherein an area of the lower electrode of the first semiconductor element is larger than an area of the upper electrode of the first semiconductor element.

10. The semiconductor device according to claim 9, further comprising:

a second semiconductor element having an upper electrode and a lower electrode;

a second upper heat sink connected to the upper electrode of the second semiconductor element; and a second lower heat sink connected to the lower electrode of the second semiconductor element, the second lower heat sink being opposed to the second upper heat sink such that the second semiconductor element is sandwiched between the second upper heat sink and the second lower heat sink, wherein the second lower heat sink is a laminated substrate having an insulator substrate and conductor layers disposed on opposite surfaces of the insulator substrate, and the second upper heat sink is a conductor plate that is a conductor having higher thermal conductivity than the insulator substrate of the second lower heat sink, the first upper heat sink is electrically connected to the second lower heat sink via a joint part, and the joint part is integrated with the first upper heat sink that is the conductor plate, and is joined to the second lower heat sink that is the laminated substrate, via a joint layer.

11. The semiconductor device according to claim 10, wherein the laminated substrate of the first lower heat sink and the laminated substrate of the second lower heat sink constitute a single laminated substrate.

* * * * *

UNITED STATES PATENT AND TRADEMARK OFFICE
CERTIFICATE OF CORRECTION

PATENT NO. : 10,658,261 B2
APPLICATION NO. : 16/260579
DATED : May 19, 2020
INVENTOR(S) : Takanori Kawashima Page 1 of 1

It is certified that error appears in the above-identified patent and that said Letters Patent is hereby corrected as shown below:

On the Title Page

Item (72), city, delete "Anjo" and insert --Anjo-shi--, therefor.

Item (71), city, delete "Kariya" and insert --Kariya-city--, therefor.

Item (73), city, delete "Kariya" and insert --Kariya-city--, therefor.

In the Specification

In Column 5, Line(s) 9, after "terminals 14,", delete "IS" and insert --15--, therefor.

In Column 5, Line(s) 19, after "terminal", delete "IS" and insert --15--, therefor.

In Column 6, Line(s) 3, delete "(SIC)" and insert --(SiC)--, therefor.

Signed and Sealed this
Eighteenth Day of August, 2020

Andrei Iancu
*Director of the United States Patent and Trademark Office*